US008891053B2

(12) United States Patent
Dziomkina et al.

(10) Patent No.: US 8,891,053 B2
(45) Date of Patent: Nov. 18, 2014

(54) LITHOGRAPHIC APPARATUS, METHOD OF MANUFACTURING AN ARTICLE FOR A LITHOGRAPHIC APPARATUS AND DEVICE MANUFACTURING METHOD

(75) Inventors: Nina Vladimirovna Dziomkina, Eindhoven (NL); Nicolaas Ten Kate, Almkerk (NL); Sandra Van Der Graaf, 's-Hertogenbosch (NL); Henricus Jozef Castelijns, Bladel (NL)

(73) Assignee: ASML Netherlands B.V., Veldhoven (NL)

(*) Notice: Subject to any disclaimer, the term of this patent is extended or adjusted under 35 U.S.C. 154(b) by 791 days.

(21) Appl. No.: 12/555,301

(22) Filed: Sep. 8, 2009

(65) Prior Publication Data

US 2010/0060870 A1 Mar. 11, 2010

Related U.S. Application Data

(60) Provisional application No. 61/136,506, filed on Sep. 10, 2008, provisional application No. 61/193,575, filed on Dec. 8, 2008.

(51) Int. Cl.
*G03B 27/52* (2006.01)
*G03F 7/20* (2006.01)
*C23C 16/455* (2006.01)

(52) U.S. Cl.
CPC ............ *G03B 27/52* (2013.01); *G03F 7/70341* (2013.01); *C23C 16/45555* (2013.01); *G03F 7/70916* (2013.01); *G03F 7/7095* (2013.01)
USPC .......................................... 355/30

(58) Field of Classification Search
CPC G03F 7/7095; G03F 7/70916; G03F 7/70341
USPC .......................................... 355/27, 30, 72, 75
See application file for complete search history.

(56) References Cited

U.S. PATENT DOCUMENTS 4,346,164 A 8/1982 Tabarelli et al.
4,480,910 A 11/1984 Takanashi et al.

(Continued)

FOREIGN PATENT DOCUMENTS

DE 221563 A1 4/1985
DE 224448 A1 7/1985

(Continued)

OTHER PUBLICATIONS

Japanese Office Action mailed Sep. 28, 2011 in corresponding Japanese Patent Application No. 2009-202649.

(Continued)

*Primary Examiner* — Peter B Kim
(74) *Attorney, Agent, or Firm* — Pillsbury Winthrop Shaw Pittman LLP

(57) ABSTRACT

A lithographic apparatus is disclosed in which a specific coating is applied to a specific surface. The coating is made from at least 99 wt % of at least one of the following: a transition metal oxide; a poor metal oxide, sulfide or selenide; a compound with the formula $ATiO_n$ where A is an element from Group 2 of the Periodic Table; or $TiO_2$ doped with a metal from Group 3, 5 or 7 of the Periodic Table, wherein the coating is less than or equal to 49 nm thick.

16 Claims, 4 Drawing Sheets

(56) References Cited

U.S. PATENT DOCUMENTS

| | | | |
|---|---|---|---|
| 4,509,852 A | 4/1985 | Tabarelli et al. | |
| 4,540,277 A | 9/1985 | Mayer et al. | |
| 5,144,363 A | 9/1992 | Wittekoek et al. | |
| 5,481,362 A | 1/1996 | Van Den Brink et al. | |
| 5,527,562 A * | 6/1996 | Balaba et al. | 427/430.1 |
| 5,528,118 A | 6/1996 | Lee | |
| 5,610,683 A | 3/1997 | Takahashi | |
| 5,623,853 A | 4/1997 | Novak et al. | |
| 5,715,039 A | 2/1998 | Fukuda et al. | |
| 5,808,715 A | 9/1998 | Tsai et al. | |
| 5,825,043 A | 10/1998 | Suwa | |
| 5,874,820 A | 2/1999 | Lee | |
| 6,268,904 B1 | 7/2001 | Mori et al. | |
| 6,297,876 B1 | 10/2001 | Bornebroek | |
| 6,307,620 B1 | 10/2001 | Takabayashi et al. | |
| 6,383,629 B1 | 5/2002 | Tsai et al. | |
| 6,496,257 B1 | 12/2002 | Taniguchi et al. | |
| 6,674,510 B1 | 1/2004 | Jasper et al. | |
| 6,717,651 B2 | 4/2004 | Kato et al. | |
| 6,724,462 B1 | 4/2004 | Singh et al. | |
| 6,741,331 B2 | 5/2004 | Boonman et al. | |
| 6,778,257 B2 | 8/2004 | Bleeker et al. | |
| 6,884,984 B2 | 4/2005 | Ye et al. | |
| 7,105,419 B2 | 9/2006 | Hiramatsu et al. | |
| 7,199,858 B2 | 4/2007 | Lof et al. | |
| 7,221,431 B2 | 5/2007 | Ohsaki | |
| 7,259,828 B2 | 8/2007 | Tolsma et al. | |
| 7,405,805 B2 | 7/2008 | Uitterdijk et al. | |
| 7,450,217 B2 | 11/2008 | Boogaard et al. | |
| 7,460,206 B2 | 12/2008 | Weissenrieder et al. | |
| 7,466,392 B2 | 12/2008 | Nagasaka et al. | |
| 7,515,246 B2 | 4/2009 | Nagasaka et al. | |
| 7,835,087 B2 | 11/2010 | Hosoe et al. | |
| 2003/0066975 A1 | 4/2003 | Okada | |
| 2003/0147058 A1* | 8/2003 | Murakami et al. | 355/53 |
| 2004/0025733 A1 | 2/2004 | Kurt et al. | |
| 2004/0065345 A1* | 4/2004 | Kobayashi | 134/1.3 |
| 2004/0119954 A1 | 6/2004 | Kawashima et al. | |
| 2004/0136494 A1 | 7/2004 | Lof et al. | |
| 2004/0165159 A1 | 8/2004 | Lof et al. | |
| 2004/0207824 A1 | 10/2004 | Lof et al. | |
| 2005/0024609 A1 | 2/2005 | De Smit et al. | |
| 2005/0025108 A1 | 2/2005 | Dillinger et al. | |
| 2005/0094279 A1* | 5/2005 | Tonar et al. | 359/604 |
| 2006/0028626 A1 | 2/2006 | Chang et al. | |
| 2006/0028628 A1 | 2/2006 | Lin et al. | |
| 2006/0077367 A1 | 4/2006 | Kobayashi et al. | |
| 2006/0119809 A1 | 6/2006 | Verhagen et al. | |
| 2006/0132731 A1 | 6/2006 | Jansen et al. | |
| 2006/0152696 A1 | 7/2006 | Boogaard et al. | |
| 2006/0170891 A1 | 8/2006 | Nishinaga et al. | |
| 2007/0258072 A1 | 11/2007 | Nagasaka et al. | |
| 2008/0038458 A1* | 2/2008 | Gemici et al. | 427/180 |
| 2008/0073602 A1 | 3/2008 | Jacobs et al. | |
| 2008/0252865 A1 | 10/2008 | Nagasaka et al. | |
| 2009/0225286 A1* | 9/2009 | Nagasaka et al. | 355/30 |

FOREIGN PATENT DOCUMENTS

| | | |
|---|---|---|
| EP | 0 467 445 | 1/1992 |
| EP | 0 906 590 | 4/1999 |
| EP | 1 420 300 A2 | 5/2004 |
| JP | 57-117238 | 7/1982 |
| JP | 58-202448 | 11/1983 |
| JP | 59-019912 | 2/1984 |
| JP | 62-065326 | 3/1987 |
| JP | 62-183522 | 8/1987 |
| JP | 63-157419 | 6/1988 |
| JP | 04-65603 | 3/1992 |
| JP | 04-305915 | 10/1992 |
| JP | 04-305917 | 10/1992 |
| JP | 05-62877 | 3/1993 |
| JP | 06-53120 | 2/1994 |
| JP | 06-124873 | 5/1994 |
| JP | 06-188169 | 7/1994 |
| JP | 07-176468 | 7/1995 |
| JP | 07-220990 | 8/1995 |
| JP | 08-37149 | 2/1996 |
| JP | 08-166475 | 6/1996 |
| JP | 08-316125 | 11/1996 |
| JP | 08-330224 | 12/1996 |
| JP | 10-163099 | 6/1998 |
| JP | 10-214783 | 8/1998 |
| JP | 10-303114 | 11/1998 |
| JP | 10-340846 | 12/1998 |
| JP | 11-16816 | 1/1999 |
| JP | 11-111587 | 4/1999 |
| JP | 11-135400 | 5/1999 |
| JP | 11-176727 | 7/1999 |
| JP | 2000-058436 | 2/2000 |
| JP | 2000-505958 | 5/2000 |
| JP | 2001-109103 | 4/2001 |
| JP | 2002-14005 | 1/2002 |
| JP | 2004-122056 | 4/2004 |
| JP | 2004-188314 | 7/2004 |
| JP | 2005-072404 | 3/2005 |
| JP | 2005-079222 | 3/2005 |
| JP | 2005-175324 | 6/2005 |
| JP | 2006-196898 | 7/2006 |
| JP | 2008-010864 | 1/2008 |
| JP | 2008-034801 | 2/2008 |
| JP | 2008-124283 | 5/2008 |
| JP | 2008-205460 | 9/2008 |
| WO | WO 99/49504 A1 | 9/1999 |
| WO | 01/35168 | 5/2001 |
| WO | 2004/019128 | 3/2004 |
| WO | 2004/051717 | 6/2004 |
| WO | 2004/053956 | 6/2004 |
| WO | 2005/031799 | 9/2004 |
| WO | 2004/093130 | 10/2004 |
| WO | 2004/093160 | 10/2004 |
| WO | 2004/105107 | 12/2004 |
| WO | WO 2005/064405 A2 | 7/2005 |
| WO | 99/49504 | 10/2005 |
| WO | 2005/124833 | 12/2005 |

OTHER PUBLICATIONS

S. Permpoon et al., "Natural and persistent superhydrophilicity of $SiO_2/TiO_2$ and $TiO_2/SiO_2$ bi-layer films", Thin Solid Films 516 (2008) pp. 957-966.

V. Pore et al., "Atomic Layer Depositioon of Photocatalytic $TiO_2$ Thin Films From Titanium Tetramethoxide and Water", Chemical Vapor Deposition, vol. 10, No. 3, (2004) pp. 143-147.

Preliminary Amendment filed in U.S. Appl. No. 11/822,964, dated Jul. 11, 2007.

Office Action issued for U.S. Appl. No. 11/822,964, dated Dec. 5, 2007.

Information Disclosure Statement filed in U.S. Appl. No. 11/822,964, dated Jul. 11, 2007.

Lev Davydov, "Photocatalytic Degradation of Organic Contaminants: Novel Catalysts and Processes," p. 211-236, ( 2001).

S. Takeda, et al. "Photocatalytic TiO2 Thin Film Deposited onto Glass by DC Magnetron Sputtering," p. 707-721.

T. Watanabe et al. "Recent Issues on Photoactive TiO2 and Advanced Applications for Glass Coatings," p. 697-706.

P. Zeman, et al. "Effect of total and oxygen partial pressures on structure of photocatalytic TiO2 films sputtered on unheated substrate," Surface and Coatings Technology, Elsevier, p. 93-99, ( 2002).

Ikuo Okada, et al. "Mask Contamination Induced by X-Ray Exposure," Jpn. J. Appl. Phys., vol. 37 (No. 12B), p. 6808-6812, (Dec. 1998).

Andrew Mills, et al. "A web-based overview of semiconductor photochemistry-based current commerical applications," Journal of Photochemistry and Photobiology A: Chemistry 152, p. 233-247, ( 2002).

R. Fretwell, et al. "An active, robust and transparent nanocrystalline anatase TiO2 thin film-preparation, characterisation and the kinetics of photodegradation of model pollutants," Journal of Photochemistry and Photobiology, p. 229-240, ( 2001).

(56) References Cited

OTHER PUBLICATIONS

Satoshi Takeda, et al. "Photocatalytic TiO2 thin film deposited onto glass by DC magnetron sputtering," Thin Solid Films 392, p. 338-344, (2001).

Toshihiro Minabe, et al. "TiO2-mediated photodegradation of liquid and solid organic compounds," Journal of Photochemistry and Photobiology, p. 53-62, (2000).

Andrew Mills, et al. "Thick titanium dioxide films for semiconductor photocatalysis," Journal of Photochemistry and Photobiology A: Chemistry, p. 185-194, (2003).

Makiko Yamagishi, et al. "Thin film TiO2 photocatalyst deposited by reactive magnetron sputtering," Thin Solid Films 442, p. 227-231, (2003).

Y. Paz, et al. "Photooxidative self-cleaning transparent titanium dioxide films on glass," J. Mater. Res., vol. 10 (No. 11), p. 2842-2848, (Nov. 1995).

B.R. Weinberger, et al. "Titanium dioxide photocatalysts produced by reactive magnetron sputtering," Appl. Phys. Lett., vol. 66 (No. 18), p. 2409-2411, (May 1, 1995).

"Photocatalytics", Photo-Catalytic Materials. (1999-2004).

Japanese Office Action mailed Dec. 4, 2012 in corresponding Japanese Patent Application No, 2009-202649.

* cited by examiner

LITHOGRAPHIC APPARATUS, METHOD OF MANUFACTURING AN ARTICLE FOR A LITHOGRAPHIC APPARATUS AND DEVICE MANUFACTURING METHOD

This application claims priority and benefit under 35 U.S.C. §119(e) to U.S. Provisional Patent Application No. 61/136,506, entitled "Lithographic Apparatus, Method of Manufacturing an Article for a Lithographic Apparatus and Device Manufacturing Method", filed on Sep. 10, 2008 and to U.S. Provisional Patent Application No. 61/193,575, entitled "Lithographic Apparatus, Method of Manufacturing an Article for a Lithographic Apparatus and Device Manufacturing Method", filed on Dec. 8, 2008. The content of each of the foregoing applications is incorporated herein in its entirety by reference.

FIELD

The present invention relates to a lithographic apparatus, a method of manufacturing an article for a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion liquid is handled by a fluid handling system or apparatus. In an embodiment the fluid handling system may supply immersion fluid and therefore be a fluid supply system. In an embodiment the fluid handling system may confine fluid and thereby be a fluid confinement system. In an embodiment the fluid handling system may provide a barrier to fluid and thereby be a barrier member. In an embodiment the fluid handling system may create or use a flow of fluid (such as gas), for example to help in handling liquid. In an embodiment immersion liquid may be used as the immersion fluid. In that case the fluid handling system may be a liquid handling system.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT Patent Application Publication No. WO 99/49504. As illustrated in FIGS. 2 and 3, liquid is supplied by at least one inlet onto the substrate (as shown by arrows or labelled with 'N'), preferably along the direction of movement of the substrate relative to the final element, and is removed by at least one outlet after having passed under the projection system (as shown by arrows or labelled with 'T'). That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets on either side of the projection system PL (as shown by arrows) and is removed by a plurality of discrete outlets arranged radially outwardly of the inlets (as shown by arrows). The inlets and outlets can be arranged in a plate with a hole in its center and through which the projection beam is projected. Liquid is supplied by one groove inlet on one side of the projection system PL and removed by a plurality of discrete outlets on the other side of the projection system PL, causing a flow of a thin film of liquid between the projection system PL and the substrate W. The choice of which combination of inlet and outlets to use can depend on the direction of movement of the substrate W (the other combination of inlet and outlets being inactive).

In European patent application publication No. EP 1420300 and United States patent application publication no. US 2004-0136494, the idea of a twin or dual stage immersion lithography apparatus is disclosed. Such an apparatus is provided with two tables for supporting a substrate. Levelling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication No. US 2006/0119809. A member is provided which covers the substrate W in all positions and which is arranged to have immersion liquid extending between it and the top surface of the substrate and/or substrate table which holds the substrate.

SUMMARY

In any kind of lithography apparatus contamination can build-up on components. This can lead to deterioration in performance. Particularly in immersion lithography, organic contamination can be deposited on components which come into contact with immersion liquid.

One of the difficulties in immersion lithography, particularly in the all-wet concept is the risk of de-wetting of a part of the substrate and/or substrate table. De-wetting is the spontaneous or induced generation and subsequent growth of a dry patch in the fluid layer on the substrate and/or substrate table. De-wetting can result in loss of thermal control such as a lack of maintenance of thermal conditioning of the substrate table and/or substrate, and/or a disturbed bulk flow of liquid off the substrate table which can result in splashing, extraction problems and the introduction of unwanted dynamic forces and defects (drying stains and bubbles).

It is desirable, for example, to provide a lithographic apparatus in which cleaning of contamination is improved and/or in which the risk of de-wetting is reduced.

According to an aspect of the invention, there is provided a lithographic apparatus comprising:

a coating of a photocatalyst on a surface of a component of the lithographic apparatus, the surface being selected from the group comprising a surface:

(i) of a sensor, wherein the lithographic apparatus is one in which, in use, the surface of the substrate available for exposure is entirely covered with immersion liquid during exposure and wherein the coating is at least 99 wt % photocatalyst;

(ii) adjacent to an opening defined at least in part by the substrate table;

(iii) of a shutter member configured to retain immersion liquid in contact with a final element of a projection system during substrate swap;

(iv) of a substrate table, wherein the lithographic apparatus is one in which, in use, the surface of the substrate available for exposure is entirely covered with immersion liquid during exposure;

(v) of a mask;

(vi) of a fluid handling system wherein the surface is at least one of the group: a radially inward surface; a surface that defines a space for immersion liquid; an upward facing surface, desirably radially inward; a radially outer lower surface; a lowermost undersurface with a single continuous coating without apertures; or the whole of the fluid handling system with a top and/or bottom with a portion with a lower contact angle;

(vii) of a passageway to provide immersion fluid to a top surface of a substrate table;

(viii) of a measurement stage;

(ix) of a plan outer edge of a substrate table wherein a surface radially inward of the plan outer edge is different in having: no coating, a coating of different thickness, or a coating of different composition;

(x) near or in an opening defined in or in part by a substrate table; or (xi) of a substrate support to support a substrate on a substrate table.

According to an aspect of the invention, there is provided a method of manufacturing a component for a lithographic apparatus comprising: using atomic layer deposition to apply a coating to a surface of the component.

According to an aspect of the invention, there is provided a lithographic apparatus comprising: a surface with a coating made up of at least 99 wt % of at least one of the following: $TiO_2$, $ZnO$, $WO_3$, $CaTiO_3$, $SnO_2$, $MoO_3$, $Nb_2O_5$, $Fe_2O_3$, $Ta_2O_5$, $ZnS$, $ZnSe$, $CdS$, $SrTiO_3$, or $ZrO_2$, and the coating and has a thickness of less than or equal to 49 nm.

According to an aspect of the invention, there is provided a lithographic apparatus comprising: a surface which has a coating made up of at least 99 wt % of at least one of the following: a transition metal oxide; a poor metal oxide, sulfide or selenide; a compound with the formula $ATiO_n$ where A is an element from Group 2 of the Periodic Table; $TiO_2$ doped with a metal from Group 3, 5 or 7 of the Periodic Table, wherein the coating is less than or equal to 49 nm thick.

According to an aspect of the invention, there is provided a lithographic apparatus comprising: a surface with a coating made up of a bi-layer of $SiO_2$ and $TiO_2$.

According to an aspect of the invention, there is provided a method of manufacturing a component for a lithographic apparatus comprising: using a sol-gel route to apply a bi-layer coating to a surface of the component.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
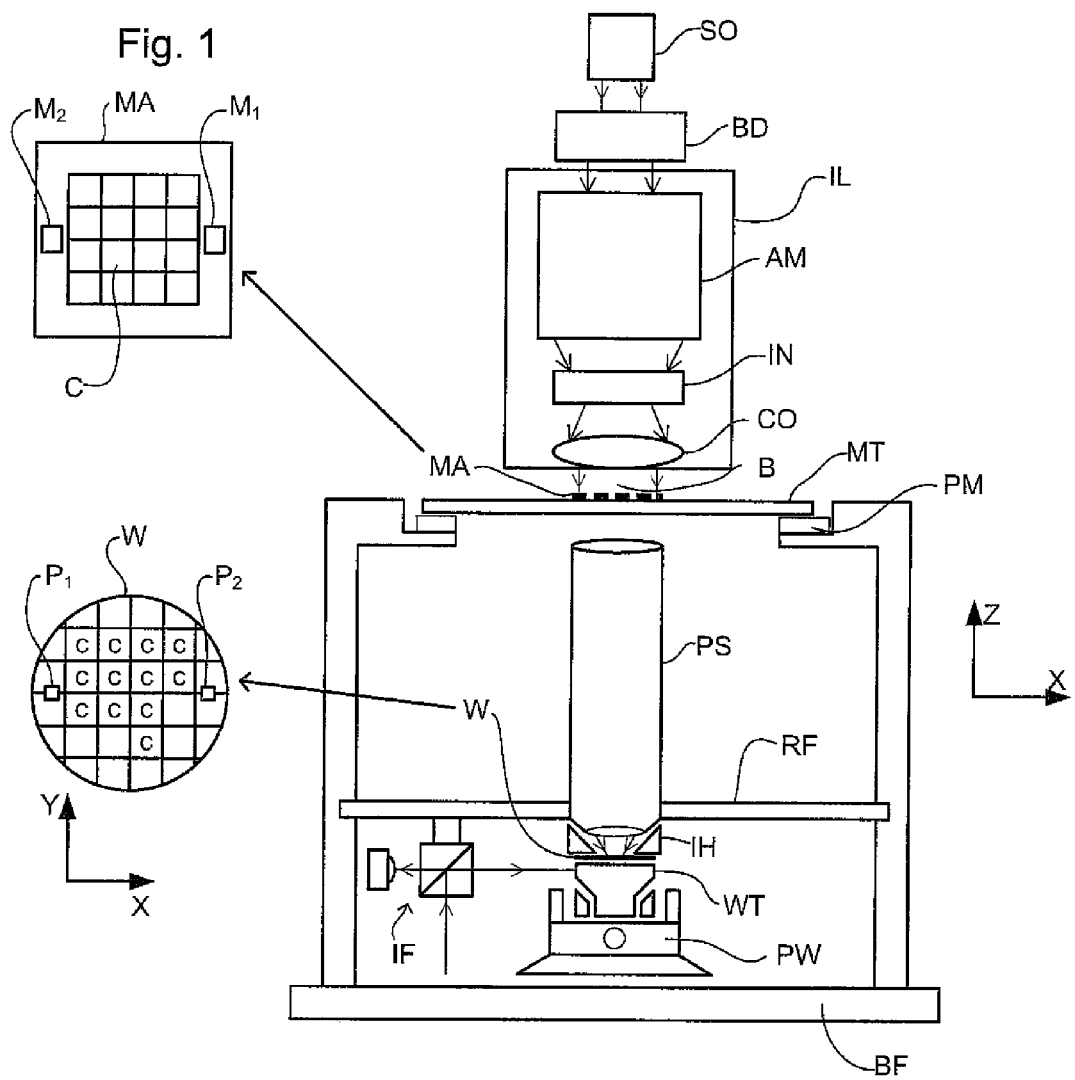
FIG. 1 depicts a lithographic apparatus according to an embodiment of the invention.
Figure 2:
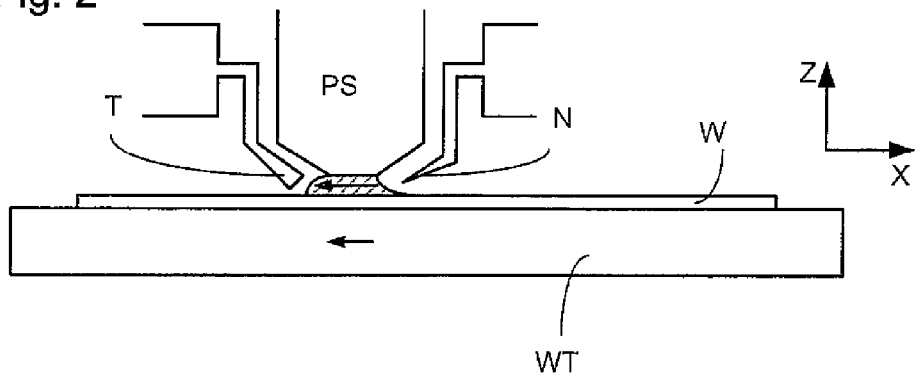
FIGS. 2 and 3 depict a liquid supply system for use in a lithographic projection apparatus.
Figure 3:
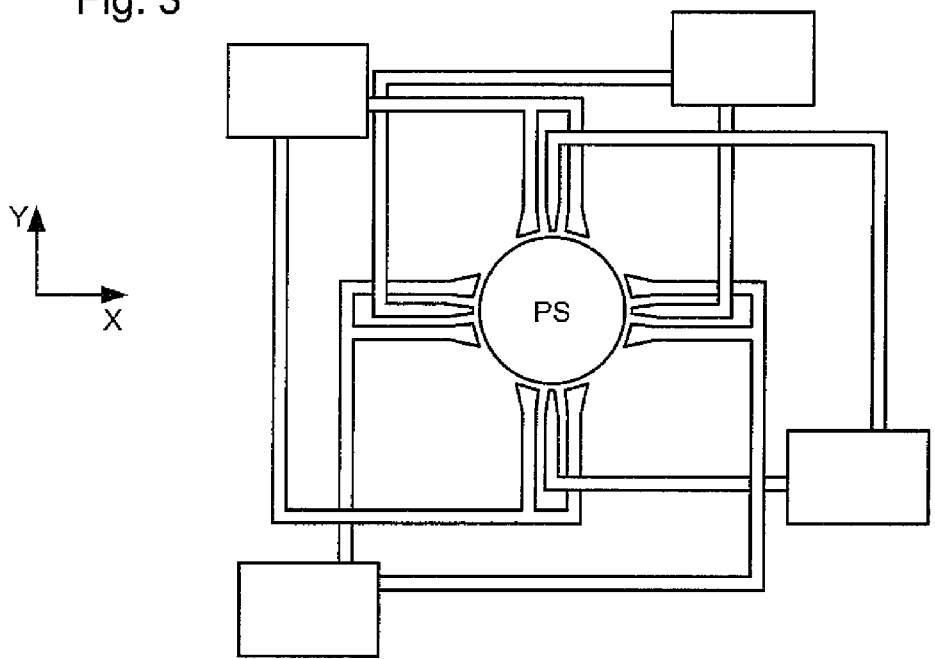
Figure 4:
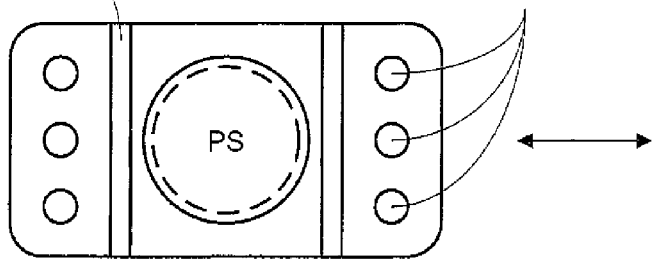
FIG. 4 depicts a further liquid supply system for use in a lithographic projection apparatus.
Figure 4:
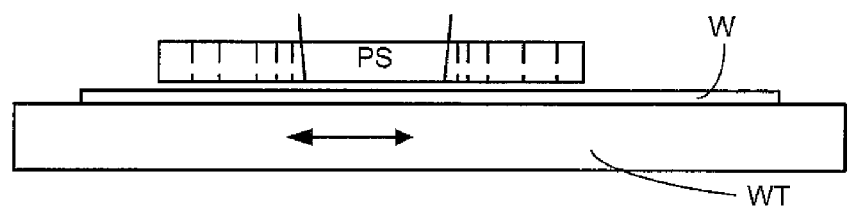

FIG. 1 schematically depicts a lithographic apparatus according to one embodiment of the invention. The apparatus comprises:

an illumination system (illuminator) IL configured to condition a radiation beam B (e.g. UV radiation or deep ultraviolet (DUV) radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, interferometric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA which is held on the support structure (e.g., mask table) MT and is patterned by the patterning device. Having traversed the patterning device MA, the radiation beam B passes through the projection system PS, which focuses the beam onto a target portion C of the substrate W. The projection system PS may be held by a metrology frame RF, which in turn may be supported on a base frame BF. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into two general categories. These are the bath type arrangement in which the whole of the substrate W and optionally part of the substrate table WT is submersed in a bath of liquid and the so called localized immersion system which uses a liquid supply system in which liquid is only provided to a localized area of the substrate. In the latter category, the space filled by liquid is smaller in plan than the top surface of the substrate and the area filled with liquid remains substantially stationary relative to the projection system PS whilst the substrate W moves underneath that area. A further arrangement, to which an embodiment of the present invention is directed, is the all wet solution in which the liquid is unconfined. In this arrangement substantially the whole top surface of the substrate and all or part of the substrate table is covered in immersion liquid during exposure of the substrate W. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

In a proposed arrangement the liquid supply system is provided with a liquid confinement member which extends along at least a part of a boundary of the space between the final element of the projection system and the substrate table. Such an arrangement is illustrated in FIG. 5.

Figure 5:
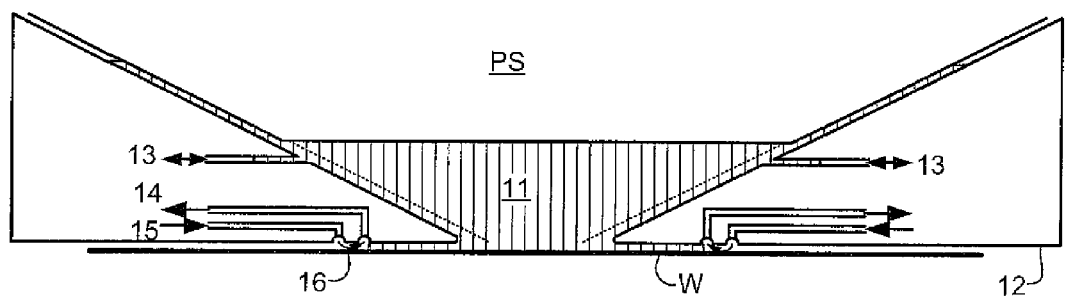
FIG. 5 depicts a further liquid supply system for use in a lithographic projection apparatus.

FIG. 5 schematically depicts a localized liquid supply system or liquid handling structure with a barrier member 12, IH. The barrier member 12, IH extends along at least a part of a boundary of the space between the final element of the projection system and the substrate table WT or substrate W. (Please note that reference in the following text to the substrate W also refers in addition or in the alternative to the substrate table WT, for example with respect to their surfaces. Reference to the substrate table WT may refer in addition or in the alternative to the substrate W. This is unless expressly stated otherwise.) The barrier member 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The barrier member 12 at least partly contains liquid in the space 11 between a final element of the projection system PL and the substrate W. A contactless seal 16 to the substrate W may be formed around the image field of the projection system so that liquid is confined within the space between the substrate W surface and the final element of the projection system PL. The space is at least partly formed by the barrier member 12 positioned below, and surrounding the final element of the projection system PL. Liquid is brought into the space below the projection system and within the barrier member 12 through liquid inlet 13. The liquid may be removed through liquid outlet 13. The barrier member 12 may extend a little above the final element of the projection system. The liquid level rises above the final element so that a buffer of liquid is provided. In an embodiment, the barrier member 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the barrier member 12 and the surface of the substrate W. The gas seal is formed by gas, e.g. air or synthetic air but, in an embodiment, $N_2$ or another inert gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between, the barrier member 12 and the substrate W contains the liquid in a space 11. The inlets/outlets are openings which may be annular grooves which surround the space 11. The annular grooves may be continuous or discontinuous. The flow of gas 16 is effective to contain the liquid in the space 11. Such a system is disclosed in United States patent application publication No. US 2004-0207824.

An embodiment of the present invention relates to a coating for use in any type of lithographic apparatus. The coating is particularly suited to immersion lithography, both localized liquid and all wet systems. In particular, an embodiment of the present invention relates to a coating which is a photocatalyst. In an embodiment the coating is a bi-layer coating. The bi-layer coating may or may not be a photocatalyst. The coating is applied to a surface of a component of a lithographic apparatus which may become contaminated. The contamination is particularly organic contamination. The action of the photocatalyst can aid in cleaning of that contamination. For example, when UV radiation (desirably radiation with a wavelength of greater than 193 nm (which is a typical projection system wavelength)) can be used to activate the photocatalyst. The coating can be used in any type of lithographic apparatus. In particular the photocatalyst may be used in an extreme ultraviolet (EUV) radiation lithographic apparatus. In this case, contamination of a reflective patterning device (e.g., a mask) may result in the patterning device becoming less reflective. The coating of an embodiment of the present invention can be applied to such a reflective patterning device for use in EUV lithography. For cleaning it may be necessary to introduce some ambient gas (e.g., oxygen, water molecules) into the EUV apparatus. For certain coatings, particularly a bi-layer coating, UV irradiation may not be needed in order to maintain the coating liquidphilic (i.e. lyophilic). That is, the coating may exhibit liquidphilicity which may be: natural, persistent (e.g. a few days) and/or regeneratable (using UV radiation and/or by rinsing with immersion liquid, for example water). The bi-layer coating may be particularly suited for an immersion lithographic apparatus.

The coating of an embodiment of the present invention is particularly useful in immersion lithography. In immersion lithography, organic contaminants, for example from the resist or a top coat or the scanner environment (e.g. airborne contamination), can be transported in the immersion liquid to a surface of a component of the apparatus. The contamination of such a surface can lead directly to a decrease in performance, for example by changing the contact angle of the immersion liquid with that surface.

An embodiment of the present invention can be used in maintaining a surface with the coating clean and thereby maintain its liquidphilic (i.e. lyophilic e.g., hydrophilic when the liquid is water) nature.

In particular, contamination of a sensor is a problem. This contamination can lead to the surface of a sensor becoming less liquidphilic. This can result in droplets being formed on the surface thereby leading to measurement errors. If the surface of a sensor can be kept liquidphilic or super liquidphilic then any liquid on the surface of the sensor will form a thin film and should evaporate evenly without forming droplets. This is desirable.

The coating comprises a material chosen from a class of materials. These materials are photocatalytic materials. That is, when applied as a coating, the material induces the degradation of organic contamination with the help of UV radiation (for example with a wavelength of 193 nm or 256 nm), leaving the material surface clean from organic contamination and therefore permanently super liquidphilic, for example super hydrophilic when the liquid is water.

These materials (photocatalysts) are photoactive transition metal oxides including, but not limited to, $TiO_2$, $ZnO$, $WO_3$, $CaTiO_3$, $SnO_2$, $MoO_3$, $Nb_2O_5$, $Fe_2O_3$, $Ta_2O_5$, $SrTiO_3$, $ZrO_2$, or mixtures thereof. Compound semiconductors, such as $ZnS$, $ZnSe$ and $CdS$ are also useful photocatalysts. Transition metal oxides (desirably from Groups 4-6 of the Periodic Table) are suitable photocatalysts. These include $TiO_2$, $WO_3$, $MoO_3$, $Ta_2O_5$, $ZrO_2$, $Nb_2O_5$, $Fe_2O_3$. Poor metal oxides, sulfides and selenids (desirably of Groups 2 and 4 of the Periodic Table) are suitable photocatalysts. These include $ZnO$, $SnO_2$, $ZnS$, $CdS$, $ZnSe$. Compounds with the formula $ATiO_n$ and $ATaO_n$ where A is an element from Group 2 of the Periodic Table are suitable photocatalysts. A photocatalyst made primarily of $TiO_2$ doped with metals from Groups 3, 5 and 7 of the Periodic Table (e.g. Cr, Mo, V, Pt) are suitable photocatalysts. The dopants are desirably present at a concentration of 0.5-1.0 wt %. Desirably the coating is 99 wt % photocatalyst. Desirably the coating is 99 wt % pure. Any mixtures of the above compounds may be suitable. Only compounds which have a reactance above a certain level may be suitable. The coating may be a compound other than any combination of the following: $TiO_2$, $SrTiO_3$, $Fe_2O_3$, $ZnO$, $ZrO_2$, $WO_3$, $CdS$, $MgF_2$, $SiO_2$, $TiO$, $ZnO_2$ or mixtures thereof. However, among these semiconductors $TiO_2$ has proven to be the most suitable for widespread environmental application. In an embodiment $TiO_2$ is in its anatase crystalline form. In an embodiment $TiO_2$ is a mixture of anatase with rutile and/or brookite crystal structures. Desirably the anatase form makes up at least 70%, desirably 80% by volume. $TiO_2$ is a biologically and chemically inert material; it is substantially stable with respect to photocorrosion and chemical corrosion, inexpensive and has a strong oxidizing/reducing power.

In an embodiment the coating is a thin film. A thin film does not necessarily cover the whole coated surface. There may be uncovered portions. This is a consequence of the thin film coating method, for example spluttering, where the location of the film on deposition is not pre-determined (i.e. it may be random). The coating may have at least 60, 70, 80, 90, 95, 98 or 100% coverage.

The above materials possess a photocatalytic activity. The applied photoactive material, when excited by the UV radiation such as a photon at a UV wavelength, and thus a UV energy, causes an electron to change quantum state, i.e. increase in energy state. That is, the UV source has a wavelength which excites a band gap of the photocatalyst thereby to induce photocatalyst activity. The change of electron state may generate free carriers in the coating, namely a conduction band electron and a valence band hole, i.e. an electron-hole pair. The creation of an electron hole pair (or the transfer of an electron to a higher energy state in the conductance band) may interact with a liquid or a molecule, such as water or a water molecule (from a gas, for example), at the surface of the coating. The hole in the valence band may act as a direct oxidant. The interaction of the electron hole pair and the liquid molecule may provide the liquid molecule with sufficient energy to dissociate into its component free radicals. That is a liquid molecule or a molecular component of a liquid molecule with an unpaired electron or an open shell configuration. If the photocatalytic interaction occurs in the presence of oxygen, such as in exposure to a gas such as air, the liquid, when it is, for example, water, may dissociate substantially into hydroxyl radicals. Hydroxyl radicals may also be formed by reaction of the valence band hole with OH or surface titanol groups. The hydroxyl radical is a powerful reactant and is the principal oxidant at the coating surface. In the present case, it is the major reactant for reacting with an organic substrate. For a hydrocarbon compound, the primary decomposition products are often carbon dioxide and water.

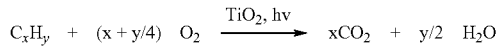

$$C_xH_y + (x+y/4)\ O_2 \xrightarrow{TiO_2,\ h\nu} xCO_2 + y/2\ H_2O$$

An embodiment of the invention can be used for cleaning off a wide variety of compounds such as (without limitation to the following list) an alkane, an aliphatic alcohol, an aliphatic carboxylic acid, an alkene, a phenol, an aromatic carboxylic acid, a dye, a simple aromatic, a halogenated alkane and alkene, a surfactant, and larger molecules derived from one or more of the aforementioned components.

In an embodiment, water may be present on the surface of the coating in liquid form. In an embodiment, the water can have oxygen deliberately dissolved in it (for example by bubbling oxygen or gas containing oxygen through the liquid before applying it to the coating). This can result in the generation of hydroxyl and oxygen radicals which help in the reaction. In an embodiment, the coating is irradiated in a gas/oxygen atmosphere. In an embodiment, the gas/oxygen is humidified gas/oxygen.

The coating layer may be applied as a thin film (of less than or equal to 49 nm, or less than 40 nm, for example selected from the range of 0.5 nm-40 nm, or less than 200 nm) using a number of conventional techniques for forming thin films in the fabrication of integrated circuits, including sol-gel, sputtering, phase reactive magnetron sputtering, chemical vapor deposition (CVD), plasma enhanced chemical vapor deposition (PECVD), metal-organic chemical vapor deposition (MDCVD), physical vapor deposition (PVD), plasma-activated evaporation, and/or atomic layer deposition (ALD). A thin layer acts better than a thick layer for its catalytic function. This is because if the layer is too thick, any formed electron-hole pair cannot reach the coating surface. Although a thin layer of between 0.5-2 nm is possible and desirable, the coating may be made thicker to improve its robustness against abrasion/scratches. Therefore, a thickness selected from the range of 0.5-100 nm, desirably from the range of 0.5-10 nm, more desirably from the range of 0.5-5 nm is foreseen. In an embodiment, the coating is one atom thick. In an embodiment, the coating is an even coating. Particularly when using atomic layer deposition, a coating thickness can be controlled accurately so that the thickness is even (i.e. constant). In an embodiment the thickness of the coating varies by less than 50, desirably less than 40 or 25 or 10 atomic layers. Furthermore, for a thicker robust layer, for example, the constant thickness may be kept constant with less than or equal to 1000 atomic layers, or less than or equal to 500 atomic layers, or less than or equal to 100 atomic layers.

As noted earlier, use of a liquid, such as in immersion lithography, may result in a stain on a surface of a component of an exposure apparatus, for example on a sensor, e.g. a transmission image sensor. Other problems that may arise in an exposure apparatus in general is the deposition of contaminants from the ambient atmosphere on various parts of the apparatus. An embodiment of the present invention can be used in either or both circumstances to help in cleaning (for keeping clean) a surface of a component.

In an embodiment, the coating is provided for a part of an exposure apparatus, for example a part of the projection system or a part of the substrate table. In an embodiment, the coating is used on one or more parts that are exposed to radiation during operation of the apparatus. In an embodiment, the coating is used for a sensor, for example an aberration sensor, a radiation dose sensor, a transmission image sensor, an alignment sensor, a sensor configured to sense properties of the projection system and/or a reflective image sensor. In an embodiment, for example when the coating is used in an immersion lithography apparatus, the coating is exposed to the immersion liquid, e.g. an aqueous liquid, for example water, during operation of the apparatus.

In an embodiment, the coating is substantially void free. In an embodiment, the coating is comprised 100% of a single photocatalyst, for example, the coating is comprised only of one of the chemicals of the following group: $TiO_2$, $ZnO$, $WO_3$, $CaTiO_3$, $SnO_2$, $MoO_3$, $Nb_2O_5$, $Fe_2O_3$, $Ta_2O_5$, $ZnS$, $ZnSe$, $CdS$, $SrTiO_3$, $ZrO_2$.

In an embodiment, the coating is liquidphilic, e.g. hydrophilic with respect to water or super-hydrophilic with a static water contact angle of less than 30°, for example less than 20°, for example less than 15°, less than 10°. The receding contact angle should be as low as possible. A liquidphilic contact angle is considered to be less than 90°. A liquidphobic contact angle (i.e., a hydrophobic contact angle with respect to water) is considered to be greater than 90°. Contact angles may be determined with any type of goniometer, for example a FTA 200 Dynamic Contact Angle Analyser (available from Camtel LTD, Elsworth, Cambridgeshire, UK) at room temperature. A liquidphilic coating may avoid staining of the coated part by an aqueous liquid in, for example, immersion lithography. The liquidphilic coating may prevent the formation of droplets and thereby prevent contaminants that may be present in the liquid from flowing to and concentrating around the perimeter of a droplet. The liquidphilic coating promotes even wetting and thereby helps avoid breaking up of a liquid layer into droplets. The coating described herein is naturally hydrophilic. However, when the coating becomes contaminated, it loses its hydrophilic property and steadily approaches, becomes or becomes more hydrophobic. Particularly in immersion lithography, change in contact angle, i.e. liquidphobic and liquidphilic properties, (especially uncontrolled and unexpected change) through and during use can be undesirable. This is because a surface is specifically chosen to be liquidphobic or liquidphilic, depending upon its position. Therefore the ability to clean the coating is an advantage because cleaning the coating helps to ensure that the liquidphilic nature of the coating can be maintained (by removing the contamination). A suitable maintenance regime is described below.

The coating, which is liquidphilic, is particularly suited to coating a surface next to a surface which is coated with a liquidphobic coating. A liquidphobic coating can be damaged by ozone, i.e. $O_3$. Other types of liquidphilic coating can be cleaned with $O_3$. However, such cleaning is not selective (because the $O_3$ is provided in gaseous form) so this can damage an adjacent liquidphobic coating. Cleaning of the liquidphilic coating described herein allows cleaning by use of UV radiation being selectively irradiated onto only the liquidphilic coating thereby not damaging an adjacent liquidphobic coatings. In an embodiment, cleaning is done with the liquidphilic and liquidphobic surfaces under a liquid, such as water. This is because UV radiation can generate $O_3$ in air. Even a thin layer of liquid can protect the liquidphobic layer and is enough for the liquidphilic layer during cleaning. Therefore the liquidphilic coating is suited to be adjacent a liquidphobic coating. There is an advantage to having liquidphobic and liquidphilic surfaces next to each other. For example, this combination can be used to pin a meniscus of liquid in place at the interface between the two surfaces.

The coating may be irradiated with UV radiation at regular intervals. For example, UV irradiation may occur after every exposure, after every batch of substrates has been exposed, after every lot of substrates, etc. In an embodiment the UV radiation has a wavelength of 266 nm.

For cleaning the coating the UV radiation could be UV-A (400-320 nm) radiation such as from a 100 W medium pressure mercury lamp. UV-B or UV-C can also be used. The UV intensity can be from 1 $\mu W/cm^2$ to 10 $mW/cm^2$. In an embodiment an intensity of 1 $mW/cm^2$ is used. The cleaning frequency could be for a duration selected from the range of 2-20 seconds every 1 minute to a duration selected from the range of 1-30 minutes every day (for an intensity of 1 $mW/cm^2$, for example). At a lower intensity (e.g. 1 $\mu W/cm^2$) a longer duration is necessary. For example, between 20 seconds every 1 minute to 400 minutes every day.

The coating may be solid, not particulate. This may be a consequence of the fabrication technique used to make the coating.

The coating may be provided on a substrate by any suitable method or process. In an embodiment, the coating is applied by reactive magnetron sputtering. In an embodiment, the coating is applied by spin coating or dip coating. In an embodiment, the substrate is a glass substrate (e.g. a glass substrate that is partly coated with a metal, e.g. chromium) or a metal halide (e.g., $CaF_2$) substrate. The coating may be made as a thin film on the surface to which the coating is applied.

The coating may have any suitable thickness. In an embodiment, the coating thickness is selected from the range of less than 1 nm, the range of 0.4 nm to 0.9 nm, the range of 2.0 nm to 2.9 nm, the range of 4 nm to 6 nm, the range of 8 nm to 14 nm, the range of 16 nm to 29 nm, the range of 31 nm to 49 nm or the range of 51 nm to 74 nm. In an embodiment, the coating has a thickness of substantially 200 nm, in the range of 180 nm to 220 nm, in the range of 190 nm to 210 nm, optionally below 200 nm. If the coating is too thick, it can lose the photocatalytic activity. In an embodiment, the coating is less than 20 nm thick. That results in a coating of about 200 atoms thick because 10 layers make up about 1 nm.

In an embodiment, the photocatalyst may be formed of a mixture of more than one compound. Only one of those compounds may be a photocatalyst. In one embodiment the coating comprises $TiO_2$ with additions of $SiO_2$ or $SiO_2$ with additions of $TiO_2$. Such a surface may stay liquidphilic for longer than a pure $TiO_2$ coating. This improvement may be due to the enhanced acidity of Si—O—Ti bonds at the $SiO_2$—$TiO_2$ interface. This produces a greater amount of hydroxyl groups at the coating surface. In an embodiment, the coating is comprised of a $TiO_2$ film which is thoroughly covered by an $SiO_2$ overlayer or of a $SiO_2$ film which is thoroughly covered by an $TiO_2$ overlayer. Each layer and overlayer may have the thickness of a single layer coating described herein. The arrangement of a layer covered by another layer (or overlayer) may be referred to as a bi-layer.

In one embodiment the coating is a sol-gel derived $SiO_2$—$TiO_2$ composite film. A sol-gel derived film may be deposited from silica and titania sols. A $SiO_2$ polymeric sol may be prepared by diluting tetraethoxysilane (TEOS) in absolute ethanol, deionized water, and hydrochloric acid (HCl). This solution may be aged at elevated temperature for several hours. Then it may be diluted in additional absolute ethanol.

A $TiO_2$ film may be deposited from two kinds of $TiO_2$ sols which are prepared using two different sol-gel routes. In one embodiment a polymeric mother solution (MS) is prepared by mixing tetraisopropyl orthotitanate (TIPT) with deionized water, hydrochloric acid, and absolute ethanol as a solvent. This solution may be aged at room temperature for two days prior to deposition. In a different embodiment, a crystalline suspension (CS) of $TiO_2$ nano-crystallites is prepared in absolute ethanol. This suspension is prepared from the mother solution. The mother solution is first diluted in an excess of deionized water ($H_2O$) and then autoclaved at elevated temperature for a few hours. Autoclaving may yield the crystallization of $TiO_2$ particles in the liquid phase. An exchange procedure may then be performed in order to remove water from the sol and to form a crystallized suspension in absolute ethanol. A final sol gel comprised of $TiO_2$ nano-crystallites of about 6 nm in diameter is suitable.

A bi-layer film may be deposited at room temperature by spin coating, for example. After deposition, some heat treatment may be necessary, for example at about 500° C. for two hours. Generally one layer will be applied first and a second layer applied thereafter.

Depositing $SiO_2$ on a coating of MS $TiO_2$ or depositing CS $TiO_2$ on a $SiO_2$ coating can result in a bi-layer film which is photoactive and liquidphilic. However, irradiation with UV radiation may be necessary after some time to restore the liquidphilicity. $SiO_2$ deposited on a CS $TiO_2$ coating exhibits a natural, persistent and regenerable liquidphilicity without the need for UV irradiation periodically (such a bi-layer film may be photoactive). Therefore, in a desirable embodiment, the coating comprises a base coating of $TiO_2$ from a crystalline suspension onto which $SiO_2$ has been applied. In an embodiment the $SiO_2$ outer layer has a thickness of between 1 and 20 monolayers, desirably less than 10 monolayers or 5 or less monolayers. Such a coating, if it loses its liquidphilicity, may have its liquidphilicity reinstated by washing with deionized water. In some immersion lithographic apparatuses, deionized water is used as the immersion liquid. Therefore, in this case no further cleaning routine or at least no further cleaning apparatus may be required. In an embodiment, the bi-layer may have a thickness of around 250 nm comprising a layer of $SiO_2$ with a thickness of around 200 nm (e.g., in the range of 150 nm to 220 nm, desirably in the range of 190 nm to 210 nm) and a layer of $TiO_2$ with a thickness of substantially 40 nm. The layer of $SiO_2$ may be on the layer of $TiO_2$. Further information about bi-layer films, in particular $SiO_2/TiO_2$ bi-layer films, can be found in the article by S. Permpoon et al. called "Natural and Persistent Superhydrophilicity of $SiO_2/TiO_2$ and $TiO_2/SiO_2$ Bi-Layer Films" in Thin Solid Films 516 (2008) pp 957-966.

An embodiment of the present invention is, in particular, directed to the all-wet immersion system. An embodiment of an all-wet system is disclosed in United States patent application publication no. US 2008-0073602. In the all-wet solution of US 2008-0073602, liquid may be supplied to the space between the final element of the projection system PS and the substrate W through a liquid handling system IH, as illustrated in FIG. 1. The liquid handling system IH comprises a plurality of openings which may supply liquid directly to that space. The liquid handling system IH may comprise a barrier which at least partly surrounds the space between the final element of the projection system and the substrate. In this embodiment the liquid handling system IH is separate from the substrate table. The liquid handling system IH is substantially stationary relative to the projection system PS. The substrate table WT can move relative to the liquid handling system. The liquid handling system IH allows liquid to leak out and flow over the remainder of the substrate W and substrate table WT.

The issue of possible de-wetting, particularly at the outer edge of the substrate table has been addressed in U.S. Patent Application Nos. 60/996,738 and 60/996,737, both filed 3 Dec. 2007. In U.S. Patent Application Nos. 60/996,738 and 60/996,737, an example of a drain 500 at the edge of the substrate table WT is given. Such a drain 500 is illustrated schematically in FIG. 7. In this way liquid is allowed to flow off the edge of the substrate table into the drain 500. Once in the drain 500, the liquid can be disposed of. This can replace the liquid collection system disclosed in US 2008-0073602. The coating of an embodiment of the present invention can help yet further reduce the risk of de-wetting in the all-wet system.

The risk of de-wetting increases when the layer thickness of the liquid on the substrate W and/or substrate table WT is reduced. The risk of de-wetting also increases when gas bubbles are present on, e.g. stuck to, the surface of the substrate W. If the contact angle of the immersion liquid to the substrate W or substrate table WT is high, this can increase the chance of de-wetting. Therefore coating the whole top surface of the substrate table WT exposed to immersion liquid in the coating described herein can help in reducing the chance of de-wetting.

Thinning of the layer of the liquid film on the substrate W and/or substrate table WT is promoted by one or more of: evaporation, draining away of the liquid over the edge of the substrate table WT; and/or motion of the substrate table WT. De-wetting is prone to be initiated at the edge of the substrate table WT in particular. A thick layer of liquid on the substrate table and/or substrate can be achieved by having a high bulk-flow supply rate from the liquid handling system IH. However, this complicates the flow management and in particular the liquid extraction at the edge of the substrate table. The de-wetting may be alleviated or at least reduced by coating the substrate table WT with the coating described herein. It is desirable to have the coating at the edge 490 of the substrate table WT, or a coating with a contact angle reducing towards the edge 490 of the substrate table WT, especially for limited bulk-flow rates. The coating may be on horizontal and/or vertical surfaces of the edge 490. Desirably the coating is present around the complete periphery of the substrate table WT. The presence of the coating, i.e. the reduction in contact angle, at the edge causes the layer of immersion liquid covering the substrate table WT substantially to pin to the edge 490 of the substrate table. The pinning effect may apply a tension to the meniscus across the surface of the immersion liquid layer, reducing the thickness of the layer and the risk of de-wetting.

Figure 6:
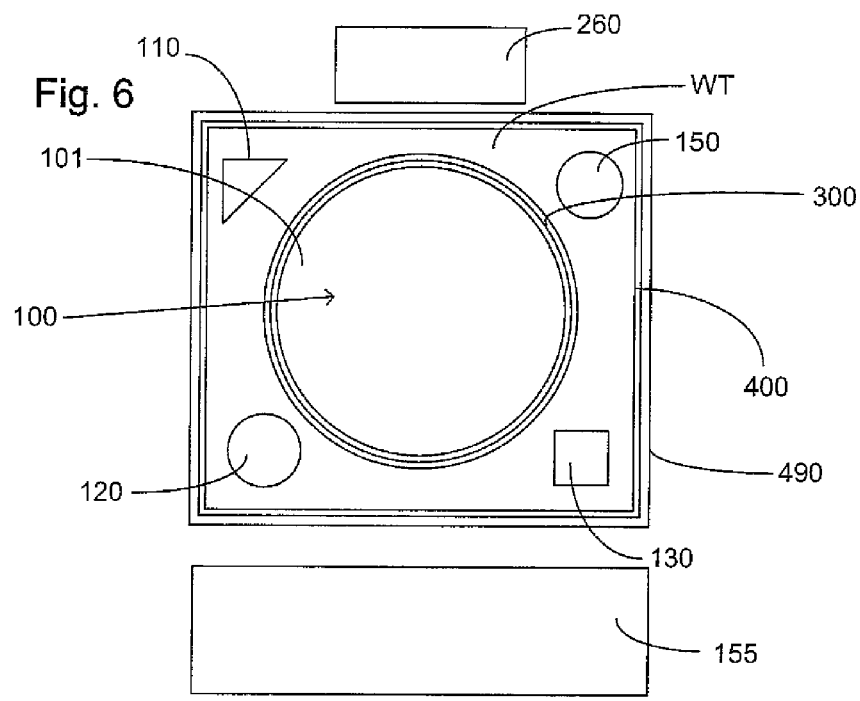
FIG. 6 depicts, in plan, a substrate table according to an embodiment of the present invention.

As shown in FIG. 6, an opening 300, 400 is provided in the substrate table WT which provides immersion liquid to the top surface of the substrate table WT. The opening 300, 400 may be defined in the top surface of the substrate table. The opening 300, 400 may provide immersion liquid in addition to the liquid handling system IH. The liquid handling system 12, IH may provide liquid to the space defined between the final element of the projection system PS and the substrate W. The opening 300, 400 may be located, in particular, adjacent a region at a high risk of de-wetting. This region includes the edge of the substrate support on which the substrate will be placed, in use, and the edge of the substrate table WT. The opening 300 may radially inward from the edge 490 of the substrate table. For example, it can be defined in the surface of the substrate table around the substrate, such as substantially at the periphery of a substrate support 101 to support the substrate during exposure. The opening may be defined radially outward in the surface of the substrate table towards the edge 490 of the substrate table, for example, before the surface of the edge curves downwards.

FIG. 6 is a plan view of a substrate table WT according to an embodiment of the present invention. In the surface of the substrate table WT is defined a first opening 300 and a second opening 400.

The substrate table WT comprises a recess 100 in the top surface of the substrate table WT. A substrate support 101 is provided in the recess 100. The substrate support 101 may be coated with a coating described herein. At the edge of the recess 100 radially outwardly of the substrate support 101 there is defined a first opening 300 through which immersion liquid may be supplied to the top surface of the substrate table WT. The first opening 300 may be provided around the edge of the recess 100. The first opening 300 may surround the substrate support 101. The opening 300 may be substantially annular. The opening 300 may be substantially the same shape as the shape of the substrate support 101 and/or substrate W.

A second opening 400 may be defined in the surface of the substrate table WT. The second opening 400 may be adjacent an edge 490 of the substrate table WT. The opening 400 may have substantially the same shape as the edge of the substrate table WT.

Both the first and second openings 300, 400 may be provided only around a part of the substrate support 101 and substrate edge 490, respectively. For example, in an embodiment, liquid may only be allowed to flow over two edges of the substrate table WT. In that instance the second opening 400 may be located only adjacent to two edges of the substrate table WT over which liquid is allowed to flow.

In an embodiment, the first and the second openings 300, 400 are each a continuous opening. In an embodiment, the openings 300, 400 are a plurality of discrete openings. The openings (discrete or continuous) may be arranged in a pattern. In the pattern of discrete openings, the openings are arranged in a repeating pattern. The discrete openings may be equidistantly apart. Each opening 300, 400 may be connected to a respective chamber 320, 420 through a respective capillary passage 310, 410. In an embodiment the capillary passages 310, 410 are continuous. In an embodiment, the chambers 320, 420 are continuous. The chambers 320, 420 may be provided with immersion liquid at one or more discrete locations. The capillary passages 310, 410 and the chambers 320, 420 may be annular.

Desirably measures are taken in order to reduce pressure fluctuations in liquid exiting the opening 300, 400. This may be achieved by having the respective chamber 320, 420. The chamber may buffer and damp the pressure fluctuations and the flow fluctuations. The buffering may be achieved by having the volume of the chamber substantially larger than the volume of the corresponding opening.

Each capillary passage 310, 410 desirably has a surface with which the immersion liquid has a low contact angle. The surface of the capillary passage 310, 410 may be coated with the coating described herein. This reduces or eliminates the creation of gas bubbles in liquid flowing in the passages 310, 410. Desirably the advancing contact angle of the immersion liquid with the surface of the capillary passage 310, 410 is less than 30°, less than 25°, or less than 20°.

The capillary passage 310, 410 desirably has a width of less than 1 mm so that the capillary forces within the passages enhance a uniform or even outflow of liquid from the openings 300, 400. The desirable width of the capillary passage 310, 410 may prevent local draining of the capillary passages 310, 410. It may be desirable to have the opening 300, 400 to be a plurality of discrete openings, where the plurality of discrete openings are the openings of a plurality of capillary passages 310, 410. Having a plurality of discrete openings may enable the outflow of immersion liquid from the openings to tend towards a substantially uniform or even outflow. Such an outflow would be closer to a uniform or even outflow than the outflow from the opening 300, 400 if it was a single annular slit shaped opening.

Figure 7:
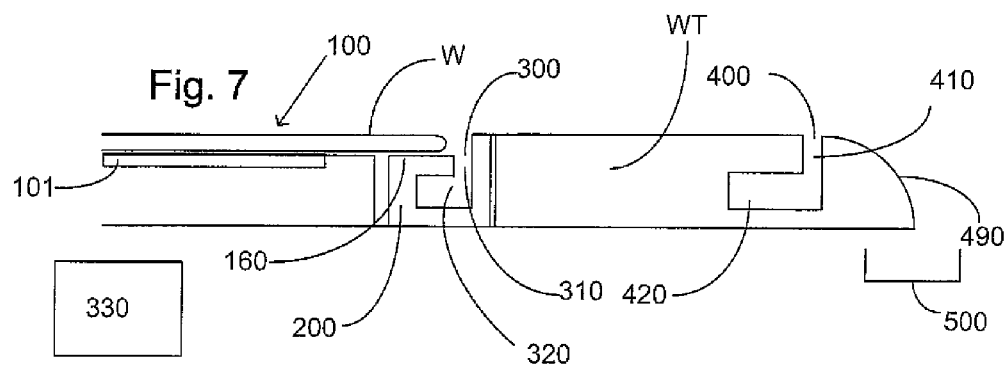
FIG. 7 illustrates, in cross section, the substrate table of FIG. 6.

As can be seen in FIG. 7, the edge 490 of the substrate table has a curved outer radius. In accordance with U.S. Patent Application Nos. 60/996,738 and 60/996,737, the radius of curvature of a portion of the edge 490 is desirably at least 5 mm. The second opening 400 is desirably provided adjacent the edge 490, desirably at a location where the flat top surface of the substrate table WT starts to curve downwards. The radius of curvature may decrease outwardly. The curved edge may help to pin the meniscus and may have a similar effect upon the immersion liquid as having the coating located at the edge of the substrate table WT. In an embodiment, the surface of the substrate table WT at the edge 490, within 5 mm (desirably within 3 mm) of the opening 400, is a surface with which the immersion liquid has an advancing contact angle of less than 30°, less than 20° or less than 15°. This enhances uniform distribution of the liquid and discourages possible gas bubbles from occurring on, e.g. sticking to, the surface. The surface may have a coating described herein applied to it.

A controller 330 may control the flow of liquid out of openings 300, 400. Operation of the controller 330 can help ensure that liquid exiting the openings 300, 400 is supplied to the top surface of the substrate table WT. The flow is desirably sufficient to yield a layer of liquid on the top surface of the substrate table WT with a thickness in the range of 10 to 5000 μm, and desirably in the range of 100 to 1000 μm or the range of 100 to 500 μm.

As is illustrated in FIG. 7, the opening 300 may be defined in a member 200 which is thermally isolated from other parts of the substrate table WT. This is only illustrated with respect to the opening 300. However, a similar system could be used for the second opening 400, for example a member in which the second opening 400 may be defined.

If a member 200 separate from the remainder of the substrate table WT is used to form the edge of the substrate table WT, then the capillary passages 310, 410 and chambers 320, 420 can be formed between that member 200 and the remainder of the substrate table WT. In an alternative or additional embodiment both openings 300, 400 are defined between the substrate table WT and an insert (not illustrated) which is placed into a recess (not illustrated) in a top surface of the substrate table WT. The insert may form a part of the top surface of the substrate table WT between the openings 300, 400. As will be appreciated, many other ways of forming the capillary passages 310, 410 and chambers 320, 420 as well as openings 300, 400 are possible.

FIG. 6 illustrates the position of, for example, three sensors. These may be a transmission image sensor (TIS) 110, a spot sensor 120 and an integrated lens interferometer at scanner (ILIAS) sensor 130. Other sensors may be a radiation dose sensor or an aberration sensor. The substrate table WT may have any type of sensor to aligning a substrate during measurement and exposure and to sense a property of the projection system. The substrate table may have any number of sensors. In the recess 100, there is a capillary passage forming surface 160. The capillary passage forming surface 160 forms one side of a capillary passage when the substrate W is in place in the recess 100 (on the substrate support 101). The bottom surface of the substrate W forms the second side of the capillary passage. More details of this arrangement can be found in U.S. Patent Application No. 61/129,047 filed on 2 Jun. 2008. Surfaces which may benefit from having the above described coating applied include the top surface of any one of the sensors, for example the TIS sensor 110, the spot sensor 120 and the ILIAS sensor 130.

In the case of a sensor being coated with the above described coating, the coating is desirably of a thickness much less than the wavelength of radiation which will impinge on the sensor. For example, the coating should be less than 10 nm thick on the surface of a sensor. In an embodiment the coating on the sensor is different from the surrounding part of the substrate table in having: a coating, a coating of different thickness, or a coating of different composition. This may be because the sensor needs to be kept cleaner than another part of the substrate table or because another part of the substrate table has a different contact angle requirements than the sensor. The capillary passage forming surface 160 may desirably have the coating applied. The capillary passage forming surface is a surface feature configured to resist the flow of liquid between the substrate W and the substrate support 101.

Although not illustrated, a seal can alternatively or additionally be provided. Such a seal may be referred to as a substrate edge seal. A substrate edge seal may have a feature configured to reduce the chance of gas from a gap between the edge of the substrate W and the substrate table WT migrating into immersion liquid present on the substrate W and/or substrate table WT. A surface feature of the substrate edge seal may be coated with the above described coating. Thus the coating described herein can be near or in an opening defined in or in part by the substrate table WT.

The surface of the capillary passage forming surface 160 which has the coating applied may be next to a surface which has a liquidphobic property. The surface of the substrate edge seal which has the coating applied may be next to a surface which has a liquidphobic property. The liquidphobic property may be the result of a coating being applied to an underlying surface or due to the nature of the surface of the uncoated material. In this way attachment/pinning of a meniscus of liquid can be encouraged at the interface between the liquidphilic surface and the liquidphobic surface. This may have an advantage in other areas of a lithographic apparatus, for example at an area on a fluid handling structure IH. Such an embodiment is described in more detail with reference to FIG. 9.

FIG. 6 illustrates a shutter member, such as a closing member 150 (i.e. a closing disk) positioned on the substrate table WT. The shutter member is for positioning underneath the liquid handling system 12, IH so as to retain immersion liquid within the liquid handling structure. It is desirable to retain immersion liquid in the space 11 during, e.g., substrate W swap. In an embodiment, the shutter member may block an opening defined in a liquid handling system 12, IH. The shutter member 150 can be seen as being a dummy substrate W or closing disk 150. Alternatively or in additionally the shutter member may be (individually or in combination, and in a non-limiting list): part of the top surface of the substrate table WT; relatively removable from the top surface of the substrate table WT for example from a position adjacent to the substrate table such as a second substrate table WT or a measurement stage 155; positioned between two stages (such as two substrate stages or a substrate stage and a measurement stage) during substrate swap, for example a bridge member 260 such as a retractable bridge. The bridge member is to bridge a gap between a first substrate table and a second substrate table during, e.g., substrate swap. The shutter member 150 may be coated with a coating described herein.

Desirably, the whole of the top surface of the substrate table WT may be coated with the coating described herein. For an all-wet system, it is desirable that the edge 490 of the substrate table is coated with the coating. This helps in preventing drying of the edge and maintaining the wetting of the substrate table, as described above.

Figure 8:
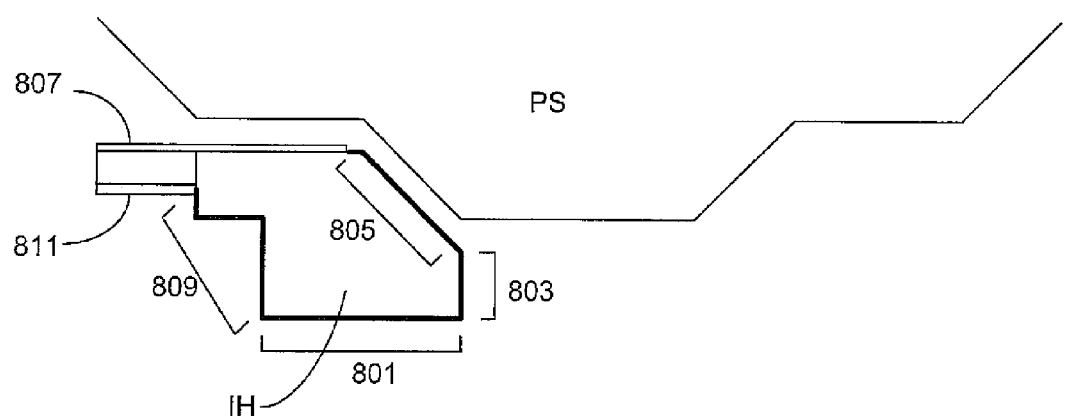
FIG. 8 is a schematic illustration of the source of ultraviolet (UV) radiation used during cleaning.

FIG. 8 illustrates a liquid handling system IH, 12 and in particular, surfaces of the liquid handling system IH which would benefit from the coating described herein. The coating described herein, which may be superliquidphilic (i.e., for water, superhydrophilic), may facilitate attachment and pinning of the immersion liquid to the liquid handling system IH, 12.

The coated surface may be the bottom, or underneath, surface 801 of the liquid handling system IH which may face the substrate W and/or the substrate table WT. Having the coating on the underneath surface 801 may facilitate filling of the space 11, preventing leakage of immersion liquid from the space 11 and migration of bubbles into the space 11. The surface 801 is the lowermost under surface. It may have a continuous coating without apertures.

A surface 803 of the liquid handing system IH which bounds the space 11 (so in part defines the space 11) may be coated with the coating. A coated surface of the liquid handling system IH may be the top surface 805 of the liquid handling system facing the projection system PS. It is desirable for the surface 805 to comprise the radially inner part of the top surface to be coated. The contact angle at a radially outward part 807 of the top surface, radially outward of the top surface 805, has a greater contact angle than the surface 805. In an embodiment it is not coated with a liquidphilic coating described herein (e.g., a superliquidphilic coating). A meniscus of the immersion liquid may pin at a radial outer edge of the surface 805. Desirably, to improve the pinning, the surface 807 may be coated with a liquidphobic coating. This may help keep droplets of immersion liquid away from the top of the liquid handling system 12, IH and the surface of the projection system PS, reducing the thermal load applied to these surfaces.

A radially outward undersurface 809 may be coated with the coating described herein. Radially outwardly of the surface 809 is a radially outward lowermost surface 811. The radially outward lowermost surface 811 desirably may not be coated and may not be liquidphilic. In an embodiment it may be coated with a liquidphobic coating. It may have a contact angle greater than the contact angle of surface 809. The radially outward edge of surface 809 may serve to pin a meniscus of the immersion liquid. In an all-wet apparatus, the meniscus pinned at the outer edge of the surface 809 may be pinned at the edge 490 of the substrate table WT. In an embodiment, the surface 811 may have a liquidphilic contact angle (and can be coated).

Figure 9:
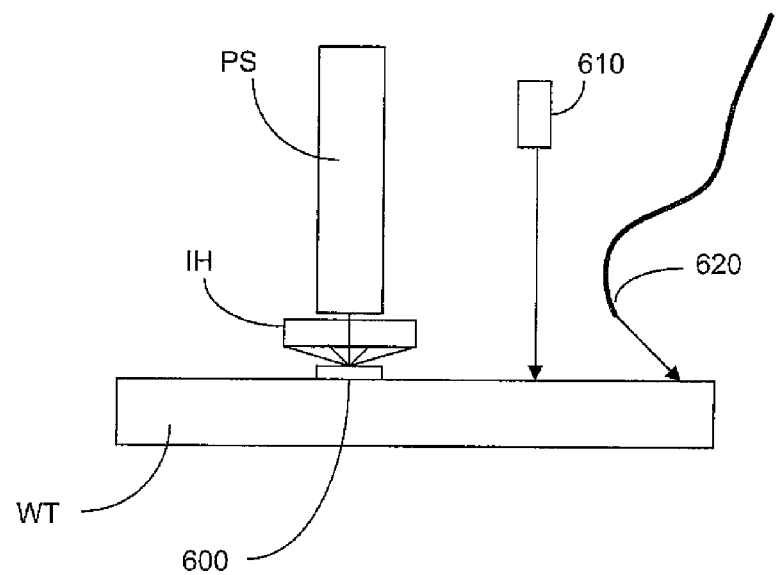
FIG. 9 is a schematic illustration, in cross-section, of a liquid handling system.

FIG. 9 illustrates several ways of applying UV radiation to the areas coated with the coating described herein. Radiation from the projection system PS may be used. For example the substrate table WT may be moved under the projection system PS so that the beam of radiation PB impinges on areas of the substrate table covered in the coating (for example, one or more of the sensors 110, 120, 130, the shutter member 150, 155, 160, the edge 490, the upwardly facing surfaces 803, 805 of the liquid handling structure 12, IH and the surfaces of and associated with the openings 300, 400). In order to irradiate the bottom surface 801, 809, 811 of the liquid handling system IH, a reflective plate 600 may be used. The reflective plate 600 may be provided on or to the substrate table WT.

In an embodiment, a separate cleaning station UV source 610 is provided. In an embodiment, the UV radiation can be provided using an optical fiber 620 as disclosed in, for example, U.S. Patent Application No. 61/006,661 filed on 25 Jan. 2008. Such an optical fiber can be used to illuminate areas which are otherwise difficult to illuminate (e.g. within the capillary passages 310, 410). In an embodiment, the capillary passages 310, 410 may be illuminated by natural reflection and/or scattering. In an embodiment, the capillary passages 310, 410 may be illuminated in the following way: The capillary passages 310, 410 are partially filled with liquid (e.g., water). This results in a meniscus forming on the top of the liquid. This meniscus can be used as a lens. That is, UV radiation is shined from above onto the meniscus and the meniscus bends the radiation so that it is directed towards the side walls of the capillary passages 310, 410. By moving the meniscus up and down in the capillary passages (which are of the order of 0.5 mm wide), UV radiation can be irradiated onto the side of the capillary passages along their length.

In an embodiment, a surface which is coated with the coating described herein is made of a material transmissive to UV radiation. For example, the surface to be coated can be made of glass (i.e. from the side of the coating which is in contact with the surface). The coating can then be irradiated through the glass. This is advantageous, particularly for a surface which is hard to access from the coating side. The material which is optically transmissive to UV radiation should not be made so thick so that the UV radiation is absorbed.

The UV source or outlet may be moveable relative to the coating or may not be moveable relative to the coating.

For a component coated with a bi-layer described above, it may not be necessary to have a UV source for cleaning. All that may be required for cleaning and maintaining the correct contact angle might be a flow of a cleaning liquid such as a flow of immersion liquid (which may be ultra pure water) over the bi-layer. Therefore, a source for a cleaning liquid may be provided. In this way the number of UV radiation sources, or their complexity to ensure irradiation of all coated surfaces, can be reduced (e.g., one or more of the radiation sources may be separate from the main UV radiation source provided through the projection system). It may not be necessary to have any separate UV radiation source for the bi-layer embodiment. If the bi-layer has a flow of immersion liquid over it during normal use, it may not be necessary to provide a separate source of cleaning liquid.

A good way to apply a coating described herein is by atomic layer deposition. Atomic layer deposition is a layer-by-layer deposition technique that is suited for coating complex geometries, like channels with a high aspect ratio (for example capillary passages 310, 410). In atomic layer deposition an oxygen precursor (for example water vapor or a mixture of water and hydrogen peroxide) is absorbed onto the surface, forming, for example, a hydroxyl group. A $TiO_2$ precursor is pulsed into the reaction chamber. The precursor reacts with the absorbed oxygen precursor, producing a waste product and a layer. The reaction continues until the surface is passivated. The $TiO_2$ precursor does not react with itself, so that the reaction is terminated after the reaction of one layer. This results in a perfectly uniform layer thickness. The excess precursor is pumped away with the waste product. The process can then start again by introducing the oxygen precursor which reacts with the layer forming a new layer. When the $TiO_2$ precursor is re-introduced this reacts with the layer and the cycle for depositing one layer is complete.

The cycle can be repeated until the desired layer thickness is achieved. Each cycle, including pulsing and pumping takes approximately 3 seconds. Common precursors for $TiO_2$ are $TiCl_4$, $TiI_4$ as well as titanium alkoxides such as titanium isopropoxide (Ti(OPr)$_4$), titanium ethoxide (Ti(OEt)$_4$), titanium tert-butoxide (Ti(OBu)$_4$) and titanium methoxide (Ti(OMe)$_4$). The article by Viljami Pore et al in Chemical Vapor Deposition 2004, 10, No. 3 pp 143-147 describes one way of depositing TiO$_2$ by ALD in detail. ALD is suitable for all materials that can be coated using standard chemical vapor deposition, such as, for example, all of the above mentioned compositions for the coating, including, but not limited to, TiO$_2$. ALD may be used to form a bi-layer coating.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

In an embodiment, there is provided a lithographic apparatus comprising: a coating of a photocatalyst on a surface of a component of the lithographic apparatus. The surface is selected from the group comprising a surface: (i) of a sensor, wherein the lithographic apparatus is one in which, in use, the surface of the substrate available for exposure is entirely covered with immersion liquid during exposure and wherein the coating is at least 99 wt % photocatalyst; (ii) adjacent to an opening defined at least in part by the substrate table; (iii) of a shutter member configured to retain immersion liquid in contact with a final element of a projection system during substrate swap; (iv) of a substrate table, wherein the lithographic apparatus is one in which, in use, the surface of the substrate available for exposure is entirely covered with immersion liquid during exposure; (v) of a mask; (vi) of a fluid handling system wherein the surface is at least one of the group: a radially inward surface; a surface that defines a space for immersion liquid; an upward facing surface, desirably radially inward; a radially outer lower surface; a lowermost undersurface with a single continuous coating without apertures; or the whole of the fluid handling system with a top and/or bottom with a portion with a lower contact angle; (vii) of a passageway to provide immersion fluid to a top surface of a substrate table; (viii) of a measurement stage; (ix) of a plan outer edge of a substrate table wherein a surface radially inward of the plan outer edge is different in having: no coating, a coating of different thickness, or a coating of different composition; (x) near or in an opening defined in or in part by a substrate table; or (xi) of a substrate support to support a substrate on a substrate table.

The surface may be a surface of a substrate table and the coating may be applied to a plan outer edge of the substrate table. In an embodiment, a region of the substrate table radially inwardly of the edge does not have the coating.

The surface may be a surface of a substrate table and may be the surface of a rim.

The surface may be a surface of the shutter member. The shutter member may be moveable independently of an associated substrate table. The shutter member may be selected from the group of: a closing disk; a bridge member; or a second table such as a measurement table or a second substrate table.

The surface may be a surface of a sensor. The coating on the sensor may be different from the surrounding part of the substrate table, in having: a coating, a coating of different thickness, or a coating of different composition. The sensor may be a sensor selected from the group of: a spot sensor, an integrated lens interferometer at scanner sensor, a transmission image sensor, an aberration sensor, or a radiation dose sensor.

The surface may be a surface adjacent to an opening defined in at least part by the substrate table. The surface may be a surface of a feature to resist the flow of liquid between a substrate and a substrate support. The surface may be a surface of a feature to reduce the chance of gas from a gap between an edge of a substrate and a substrate table migrating into immersion fluid on the substrate and/or substrate table.

The coating may be liquidphilic, desirably super-liquidphilic. The photocatalyst may be a photoactive transition metal oxide or a compound semiconductor. The photocatalyst may be at least one selected from the group comprising: TiO$_2$, ZnO, WO$_3$, CaTiO$_3$, SnO$_2$, MoO$_3$, Nb$_2$O$_5$, Fe$_2$O$_3$, Ta$_2$O$_5$, ZnS, ZnSe, CdS, SrTiO$_3$, ZrO$_2$. The coating may comprise a bi-layer. The coating may comprise TiO$_2$ and SiO$_2$. The coating may comprise a base layer of one of TiO$_2$ or SiO$_2$ onto which the other of TiO$_2$ or SiO$_2$ has been applied. The base layer and/or the applied TiO$_2$ or SiO$_2$ may be deposited by a sol-gel route. The sol-gel route may make use of a polymeric mother solution and/or a crystalline suspension. The base layer may comprise TiO$_2$. The TiO$_2$ may be deposited as a crystalline suspension.

The lithographic apparatus may be an immersion lithographic apparatus.

The coating may be at least 99 wt % photocatalyst. The coating has a layer with a thickness of less than or equal to 49 nm.

In an embodiment, there is provided a lithographic apparatus comprising a surface with a coating made up of at least 99 wt % of at least one of the following: TiO$_2$, ZnO, WO$_3$, CaTiO$_3$, SnO$_2$, MoO$_3$, Nb$_2$O$_5$, Fe$_2$O$_3$, Ta$_2$O$_5$, ZnS, ZnSe, CdS, SrTiO$_3$, or ZrO$_2$. The coating has a thickness of less than or equal to 49 nm.

The coating may be CaTiO$_3$, SnO$_2$, MoO$_3$, Nb$_2$O$_5$, Ta$_2$O$_5$, ZnS, and/or ZnSe. The coating may comprise a bi-layer. The coating may comprise TiO$_2$ and SiO$_2$.

In an embodiment, there is provided a lithographic apparatus comprising: a surface with a coating made up of a bi-layer of SiO$_2$ and TiO$_2$.

The coating may comprise a base layer of one of TiO$_2$ or SiO$_2$ onto which the other of TiO$_2$ or SiO$_2$ has been applied. The base layer and/or applied TiO$_2$ or SiO$_2$ may be deposited by a sol-gel route. The sol-gel route may make use of a polymeric mother solution and/or a crystalline suspension.

The base layer may comprise $TiO_2$. The $TiO_2$ may be deposited as a crystalline suspension. The coating may be on a sensor. The sensor may comprise a spot sensor, an integrated lens interferometer at scanner sensor, a transmission image sensor, an aberration sensor, or a radiation dose sensor.

The surface may be a surface selected from the group comprising: a surface of a feature to resist the flow of liquid between a substrate and a substrate support; a surface of a feature to reduce the chance of gas from a gap between an edge of a substrate and a substrate table migrating into immersion fluid on the substrate and/or substrate table; a shutter member to block an opening of a liquid handling system during substrate swap such that immersion liquid remains in contact with a final element of a projection system during substrate swap; a substrate table; a mask; a liquid handling system; a bridge member to bridge a gap between a first substrate table and a second substrate table, or a measurement stage; a measurement stage; the surface of a passageway to provide immersion fluid to a top surface of a substrate table.

In an embodiment, there is provided a lithographic apparatus comprising: a surface which has a coating made up of at least 99 wt % of at least one of the following: a transition metal oxide; a poor metal oxide, sulfide or selenide; a compound with the formula $ATiO_n$, where A is an element from Group 2 of the Periodic Table; or $TiO_2$ doped with a metal from Group 3, 5 or 7 of the Periodic Table. The coating is less than or equal to 49 nm thick.

The apparatus may be an immersion apparatus and the surface, in use, in contact with immersion fluid. The coating may be substantially void free. The photocatalyst may be $TiO_2$ in its anatase form or in a combination of anatase form with rutile form and/or brookite form. The coating may be 100% photocatalyst.

The coating may comprise a layer with a thickness is selected from the range of 0.4 nm to 0.9 nm, the range of 2.0 nm to 2.9 nm, the range of 4 nm to 6 nm, the range of 8 nm to 14 nm, the range of 16 nm to 29 nm, the range of 31 nm to 49 nm or the range of 51 nm to 74 nm. The coating may have a layer with a thickness selected from the range of 2 nm-40 nm. The coating may have a layer with a thickness of less than or equal to 200 nm. The coating may be a bi-layer.

The coating may be solid, not particulate.

The lithographic apparatus may comprise a UV source to irradiate the coating. The UV source may have a wavelength which excites a band gap of the photocatalyst to induce photocatalyst activity. The wavelength of the UV source may be greater than 193 nm.

The lithographic apparatus may comprise a liquid source to provide immersion liquid on the coating during cleaning. The coating may be adjacent a liquidphobic surface. The coating may have a thickness which is constant within 50 atomic layers, optionally less than or equal to 100, less than or equal to 500, or less than or equal to 1000 atomic layers. The coating may be such that an immersion liquid has a contact angle with it of less than 30°, less than 25°, less than 20°, less than 15° or less than 10°. The coating may be such that an immersion liquid has a contact angle with it of above 15°.

In an embodiment, there is provided a method of manufacturing a component for a lithographic apparatus comprising: using atomic layer deposition to apply a coating to a surface of the component.

The coating may be a photocatalyst. The coating may be a bi-layer.

In an embodiment, there is provided a method of manufacturing a component for a lithographic apparatus comprising: using a sol-gel route to apply a bi-layer coating to a surface of the component.

In a first layer, one of $TiO_2$ or $SiO_2$ may be applied onto which the other of $TiO_2$ or $SiO_2$ may be coated. The first layer may comprise $TiO_2$. The $TiO_2$, $SiO_2$, or both, may be applied by means of a crystalline suspension.

While specific embodiments of the invention have been described above, it will be appreciated that the invention may be practiced otherwise than as described. For example, the invention may take the form of one or more computer programs containing one or more sequences of machine-readable instructions describing a method as disclosed above, or one or more data storage medium (e.g. semiconductor memory, magnetic or optical disk) having such one or more computer program stored therein. The one or more different controllers referred to herein may be operable when the one or more computer programs are read by one or more computer processors located within at least one component of the lithographic apparatus. One or more processors are configured to communicate with the at least one of the controllers; thereby the controller(s) operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a system configured to transfer a pattern to a substrate; and
   a coating of a photocatalyst adhered on a surface of a component of the lithographic apparatus, the coating comprising a bi-layer having the photocatalyst as a base layer and having an overlying layer, exposed to the environment, to shield the photocatalyst from the environment, wherein the overlying layer is thicker than the base layer.

2. The lithographic apparatus of claim 1, further comprising a substrate table and wherein the surface is a surface of the substrate table and the coating is applied to a plan outer edge of the substrate table and a region of the substrate table radially inwardly of the edge does not have the coating.

3. The lithographic apparatus of claim 1, further comprising a substrate table and wherein the surface is a surface of the substrate table and is the surface of a rim.

4. The lithographic apparatus of claim 1, further comprising a shutter member and wherein the surface is a surface of the shutter member, wherein the shutter member is moveable independently of an associated substrate table.

5. The lithographic apparatus of claim 1, further comprising a sensor and a substrate table and wherein the surface is a surface of the sensor and the coating on the sensor is different from a surrounding part of the substrate table, in having: a coating, a coating of different thickness, or a coating of different composition.

6. The lithographic apparatus of claim 1, further comprising a substrate table having an opening defined at least in part by the substrate table and wherein the surface is a surface adjacent to the opening and is a surface of a feature to resist the flow of liquid between a substrate and a substrate support; or a surface of a feature to reduce the chance of gas from a gap between an edge of a substrate and a substrate table migrating into immersion fluid on the substrate and/or substrate table.

7. The lithographic apparatus of claim 1, wherein the photocatalyst is at least one selected from the following: $TiO_2$, $ZnO$, $WO_3$, $CaTiO_3$, $SnO_2$, $MoO_3$, $Nb_2O_5$, $Fe_2O_3$, $Ta_2O_5$, $ZnS$, $ZnSe$, $CdS$, $SrTiO_3$, $ZrO_2$.

8. The lithographic apparatus of claim 1, wherein the coating comprises a base layer of $TiO_2$ onto which $SiO_2$ has been applied.

9. The lithographic apparatus of claim 1, wherein the coating is at least 99 wt % photocatalyst.

10. The lithographic apparatus of claim 1, wherein the surface is a surface of a mask.

11. The lithographic apparatus of claim 1, further comprising a measurement stage and wherein the surface is a surface of the measurement stage.

12. The lithographic apparatus of claim 1, further comprising a fluid handling system configured to maintain fluid between the system and a substrate table, wherein the surface is a surface of the fluid handling system and the surface is at least one of the group: a radially inward surface; an upward facing surface; a radially outer lower surface; a lowermost undersurface with a single continuous coating without apertures; or the whole of the fluid handling system with a top and/or bottom with a portion with a lower contact angle.

13. A lithographic apparatus comprising:

a substrate table;

a projection system configured to transfer a pattern to a substrate;

a liquid supply system configured to provide liquid between the projection system and the substrate table; and a surface with a coating adhered thereon, the coating exposed, in use, to the liquid and the coating made up of a bi-layer of $SiO_2$ and $TiO_2$, wherein the $TiO_2$ is a base layer on which the $SiO_2$, exposed to the environment, has been applied as a layer thicker than that of the $TiO_2$ to shield the $TiO_2$ from the environment.

14. The lithographic apparatus of claim 13, further comprising a projection system configured to transfer a pattern to a substrate and a fluid handling system configured to maintain fluid between the projection system and a substrate table, wherein the surface is a surface of the fluid handling system and the surface is at least one of the group: a radially inward surface; an upward facing surface; a radially outer lower surface; a lowermost undersurface with a single continuous coating without apertures; or the whole of the fluid handling system with a top and/or bottom with a portion with a lower contact angle.

15. The lithographic apparatus of claim 13, wherein the layer of $SiO_2$ is in the range from about 150 nm to 220 nm.

16. The lithographic apparatus of claim 13, wherein the layer of $TiO_2$ is less than or equal to 49 nm thick.

* * * * *